(12) United States Patent
Yang et al.

(10) Patent No.: US 10,608,090 B2
(45) Date of Patent: Mar. 31, 2020

(54) METHOD OF MANUFACTURING A SPLIT-GATE FLASH MEMORY CELL WITH ERASE GATE

(71) Applicant: Silicon Storage Technology, Inc., San Jose, CA (US)

(72) Inventors: Jeng-Wei Yang, Zhubei (TW); Chun-Ming Chen, New Taipei (TW); Man-Tang Wu, Xinpu Township (TW); Chen-Chih Fan, Hsinchu County (TW); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 57 days.

(21) Appl. No.: 16/137,399

(22) Filed: Sep. 20, 2018

(65) Prior Publication Data
US 2019/0103470 A1    Apr. 4, 2019

Related U.S. Application Data

(60) Provisional application No. 62/567,840, filed on Oct. 4, 2017.

(51) Int. Cl.
| | |
|---|---|
| *H01L 29/423* | (2006.01) |
| *H01L 29/08* | (2006.01) |
| *H01L 29/66* | (2006.01) |
| *H01L 21/28* | (2006.01) |
| *H01L 21/02* | (2006.01) |

(Continued)

(52) U.S. Cl.
CPC .. *H01L 29/42328* (2013.01); *H01L 27/11521* (2013.01); *H01L 27/11546* (2013.01); *H01L 29/0847* (2013.01); *H01L 29/40114* (2019.08); *H01L 29/665* (2013.01); *H01L 29/6653* (2013.01); *H01L 29/6656* (2013.01); *H01L 29/66825* (2013.01); *H01L 21/0217* (2013.01); *H01L 21/0274* (2013.01); *H01L 21/02164* (2013.01); *H01L 21/02236* (2013.01); *H01L 21/26513* (2013.01); *H01L 21/31053* (2013.01); *H01L 21/76224* (2013.01)

(58) Field of Classification Search
CPC ................................................ H01L 29/42328
See application file for complete search history.

(56) References Cited

U.S. PATENT DOCUMENTS

| | | | |
|---|---|---|---|
| 5,029,130 | A | 7/1991 | Yeh |
| 5,043,940 | A | 8/1991 | Harari et al. |

(Continued)

FOREIGN PATENT DOCUMENTS

TW    201644040 A    12/2016

*Primary Examiner* — William A Harriston
(74) *Attorney, Agent, or Firm* — DLA Piper LLP (US)

(57) ABSTRACT

A method of forming a memory device with memory cells in a memory area, and logic devices in first and second peripheral areas. The memory cells each include a floating gate, a word line gate and an erase gate, and each logic device includes a gate. The oxide under the word line gate is formed separately from a tunnel oxide between the floating and erase gates, and is also the gate oxide in the first peripheral area. The word line gates, erase gates and gates in both peripheral areas are formed from the same polysilicon layer. The oxide between the erase gate and a source region is thicker than the tunnel oxide, which is thicker than the oxide under the word line gate.

10 Claims, 29 Drawing Sheets

(51) Int. Cl.
*H01L 21/027* (2006.01)
*H01L 21/3105* (2006.01)
*H01L 21/762* (2006.01)
*H01L 21/265* (2006.01)
*H01L 27/11546* (2017.01)
*H01L 27/11521* (2017.01)

(56) References Cited

U.S. PATENT DOCUMENTS

| | | | |
|---|---|---|---|
| 6,747,310 B2 * | 6/2004 | Fan | H01L 27/11521 257/316 |
| 6,992,929 B2 | 1/2006 | Chen et al. | |
| 8,711,636 B2 | 4/2014 | Do et al. | |
| 2016/0217849 A1 * | 7/2016 | Do | G11C 16/0458 |
| 2017/0103991 A1 * | 4/2017 | Kim | H01L 29/42328 |

* cited by examiner

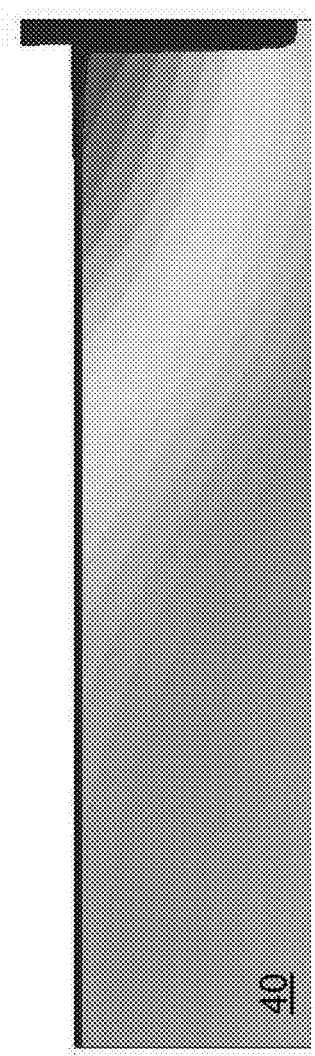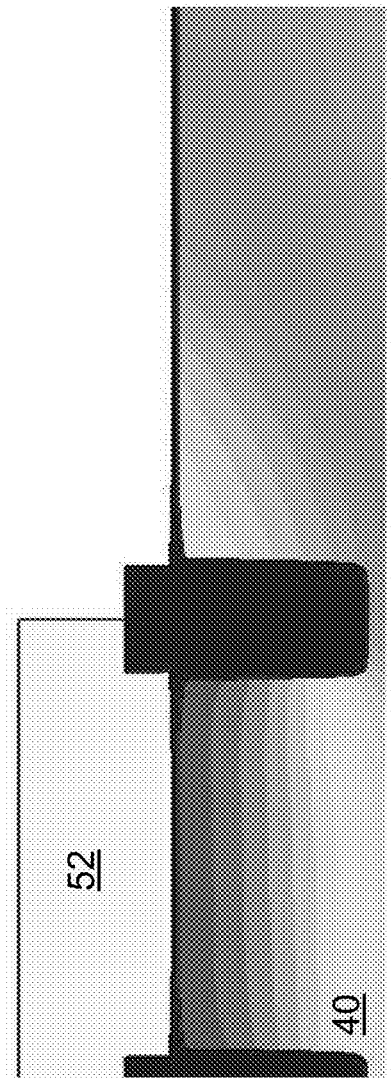

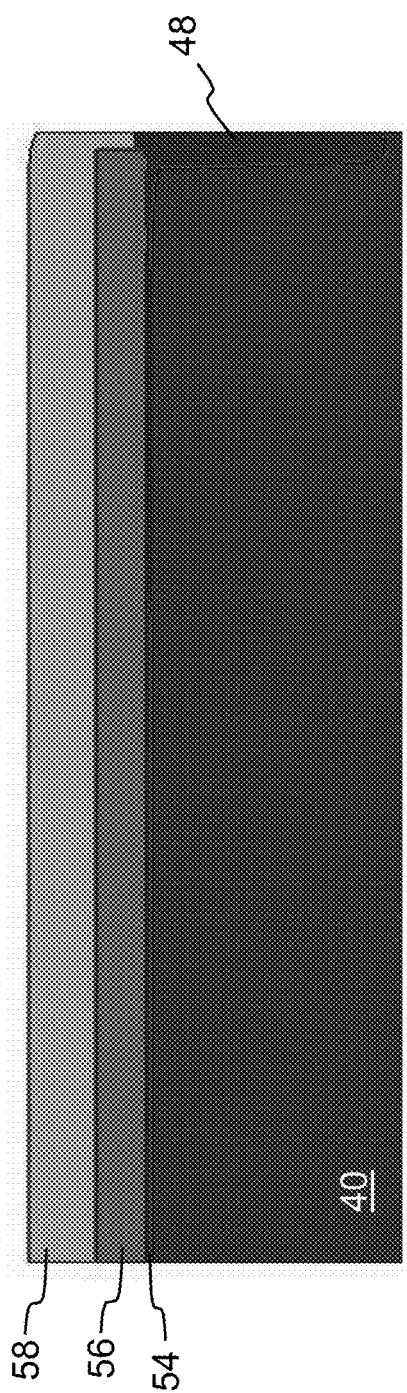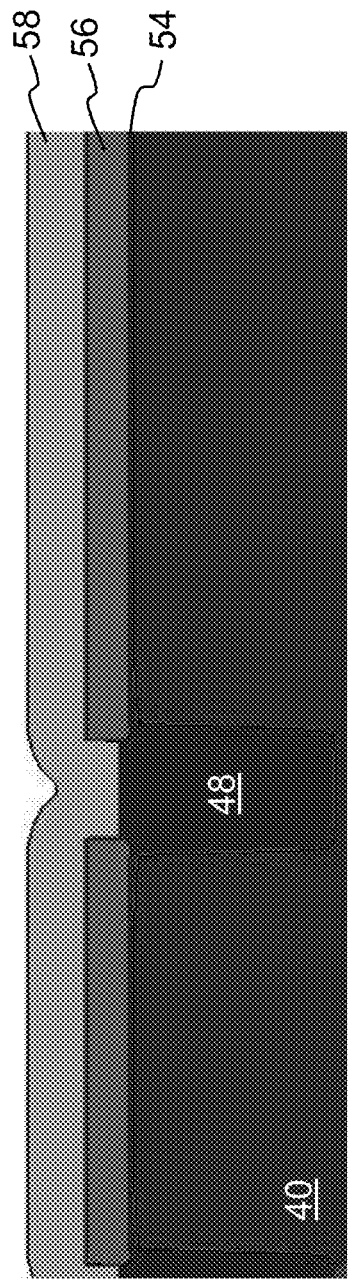
FIG. 12A
FIG. 12B

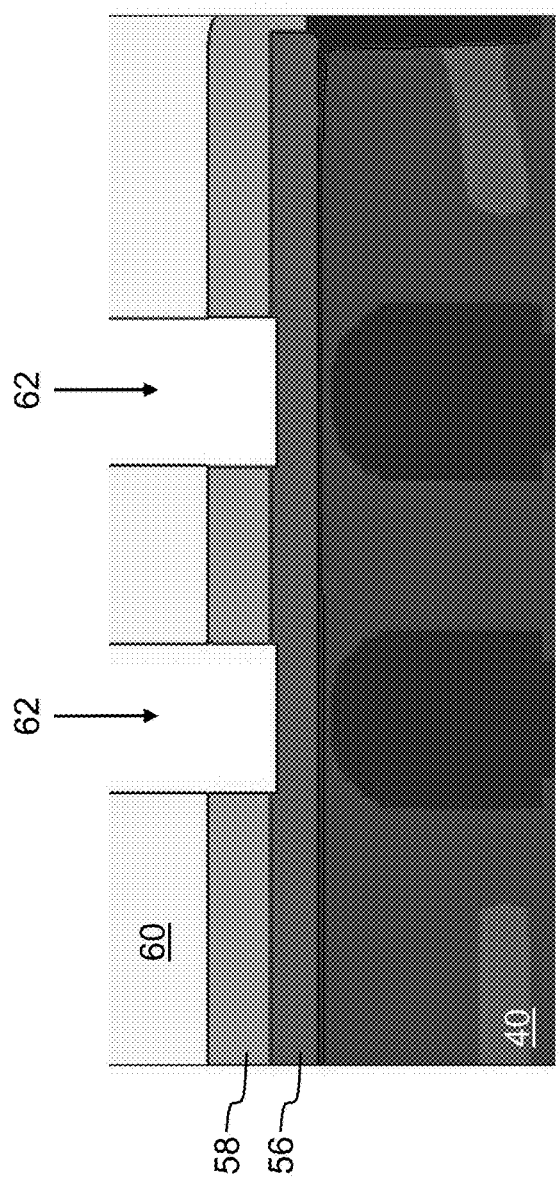
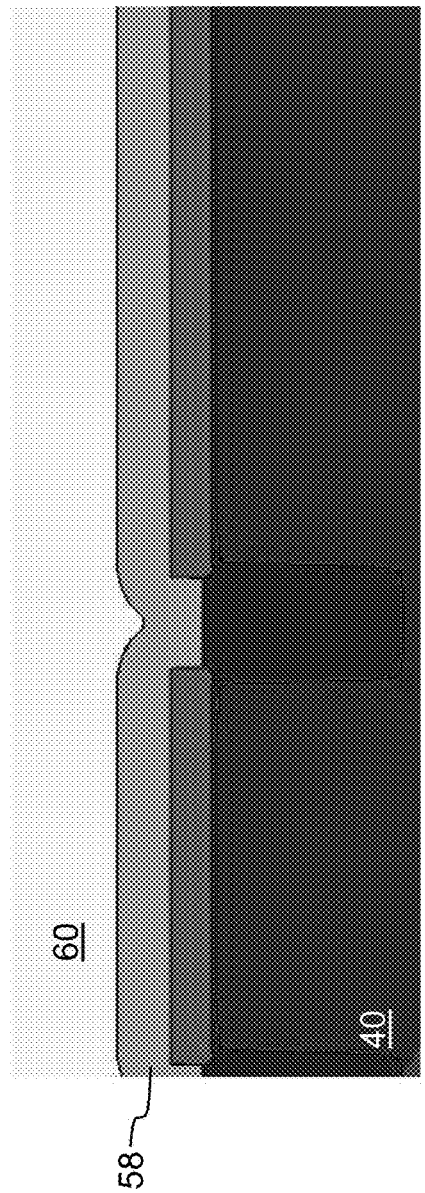
FIG. 13A
FIG. 13B

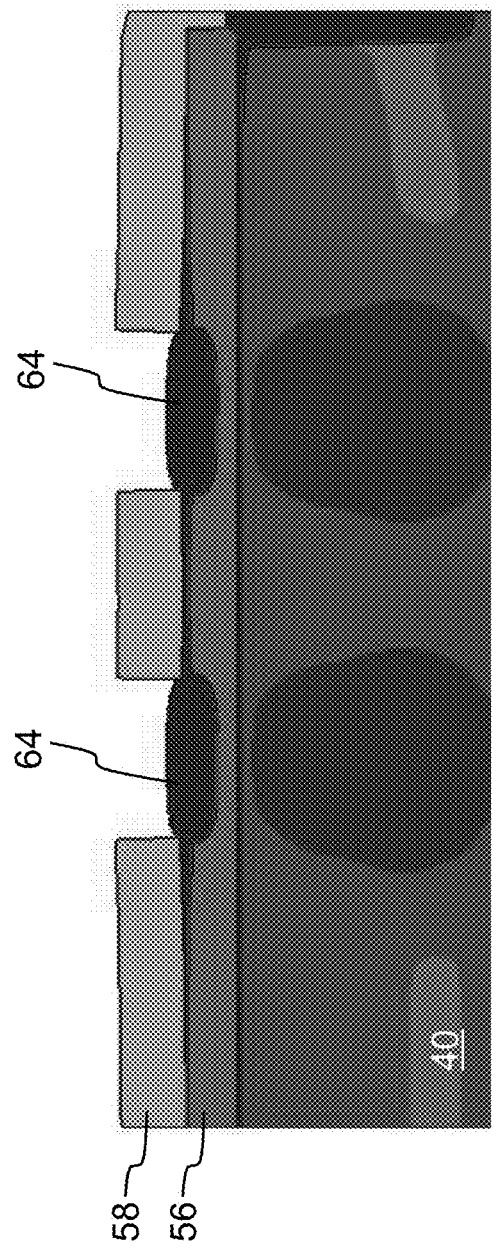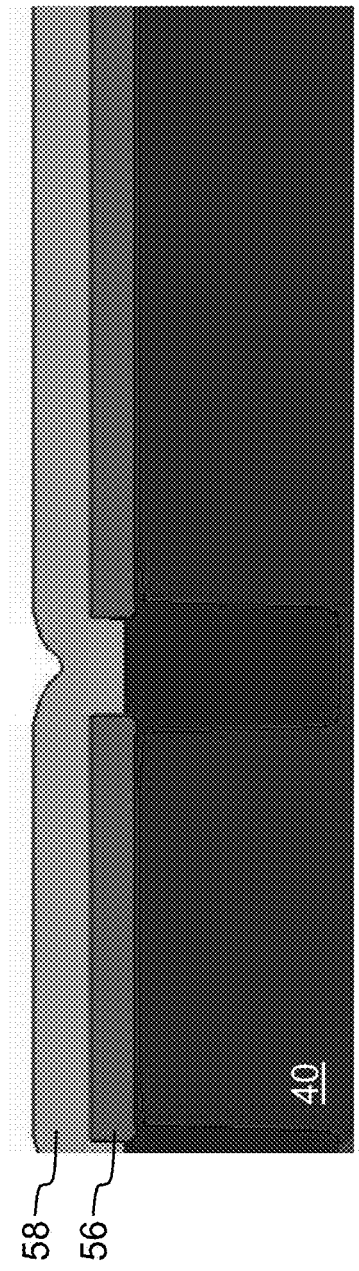
FIG. 14A
FIG. 14B

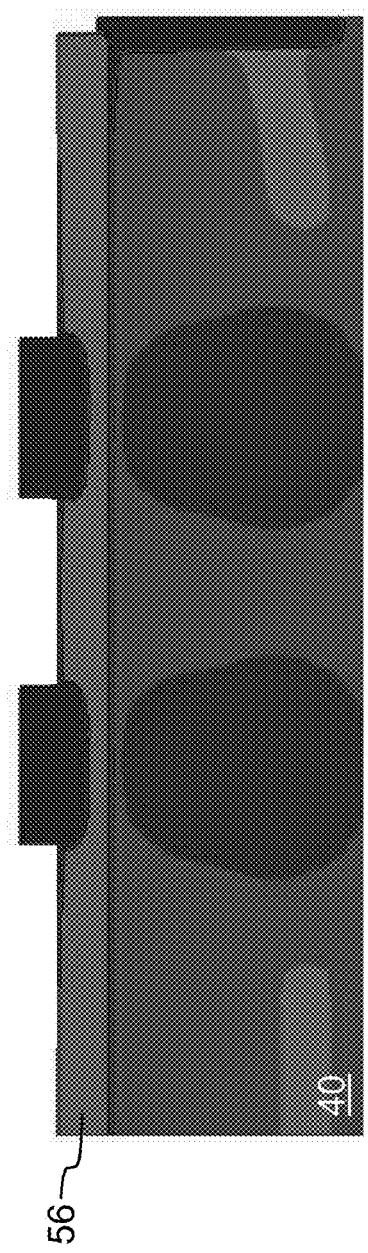
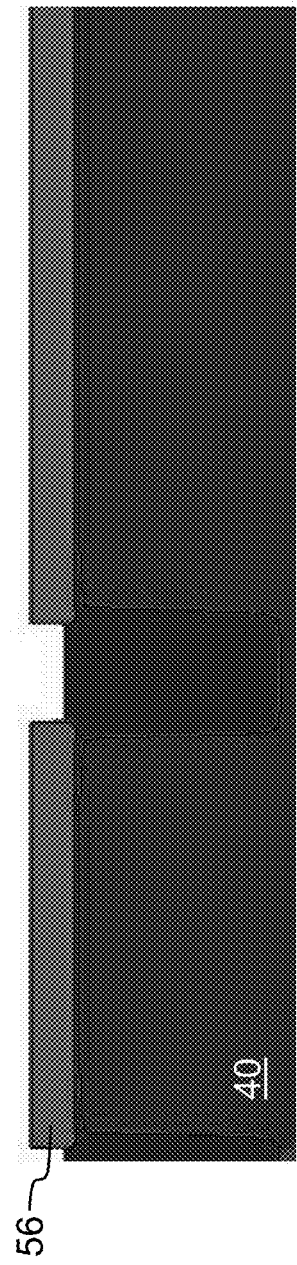

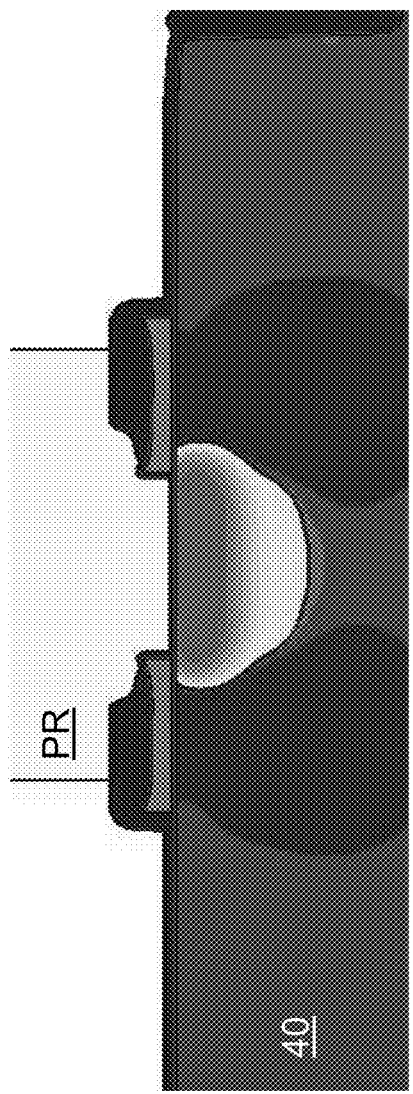
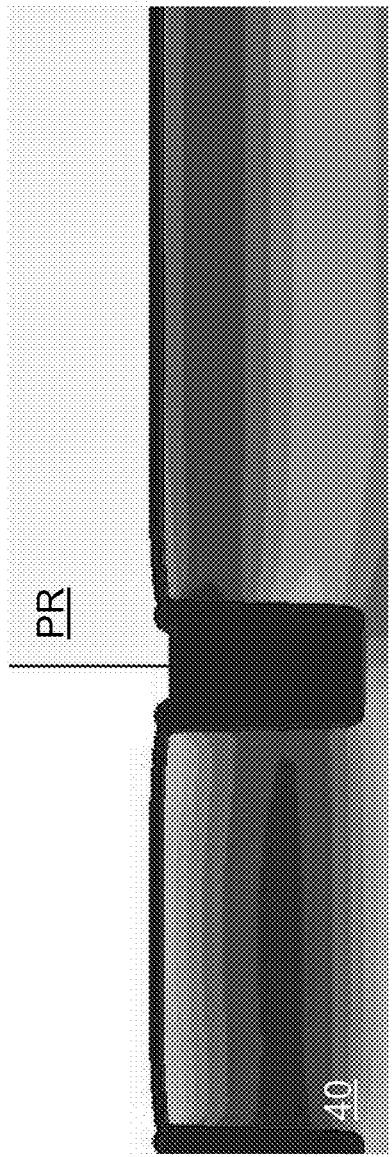
FIG. 23A
FIG. 23B

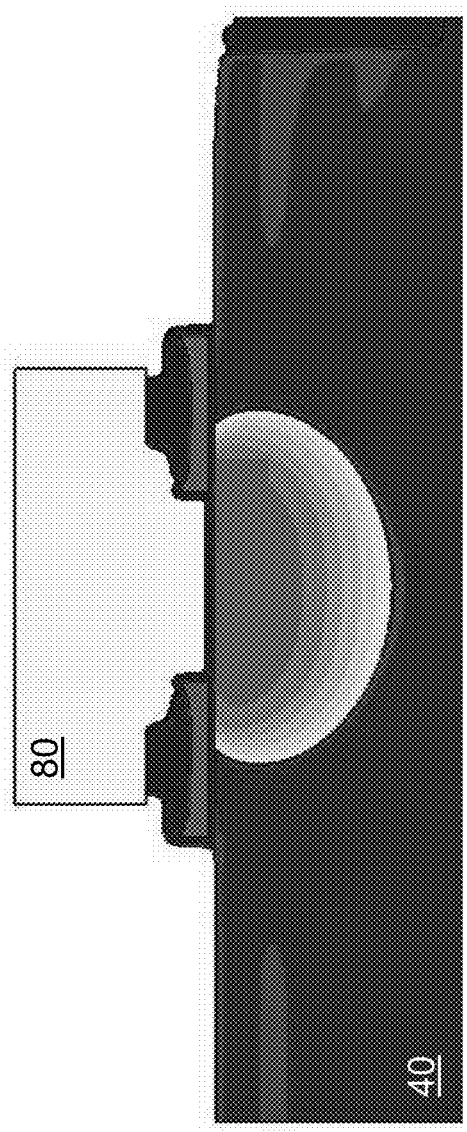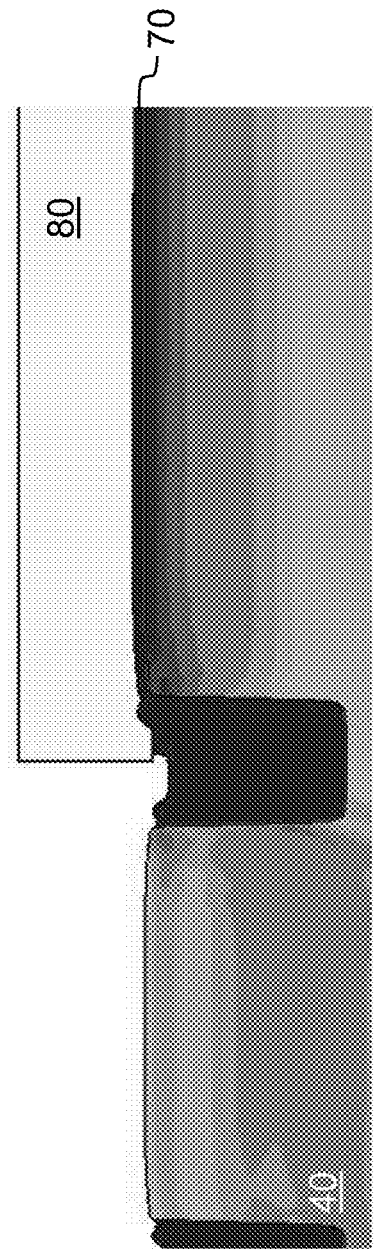
FIG. 25A
FIG. 25B

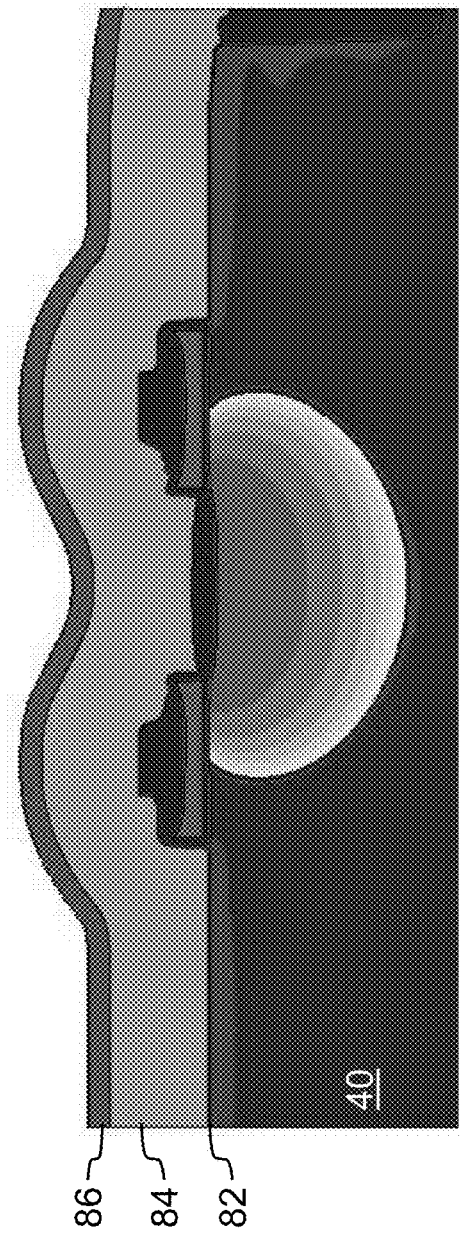
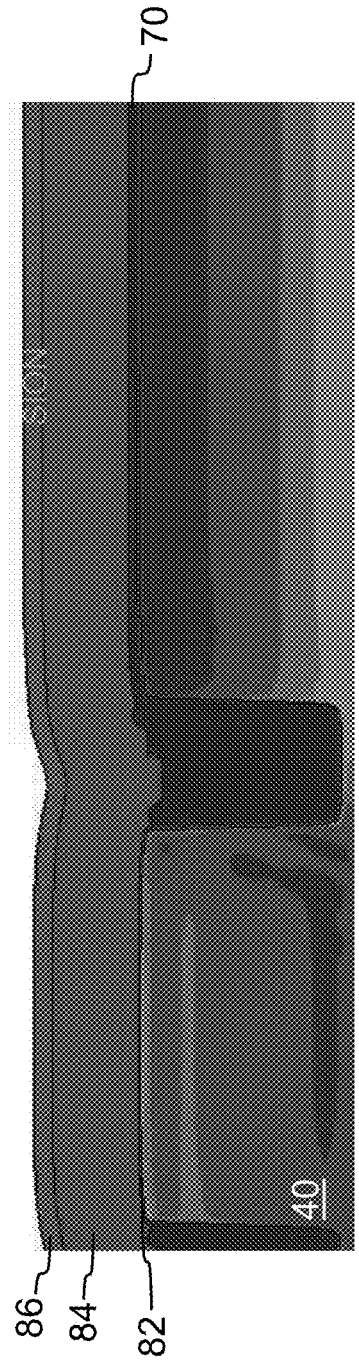
FIG. 26A
FIG. 26B

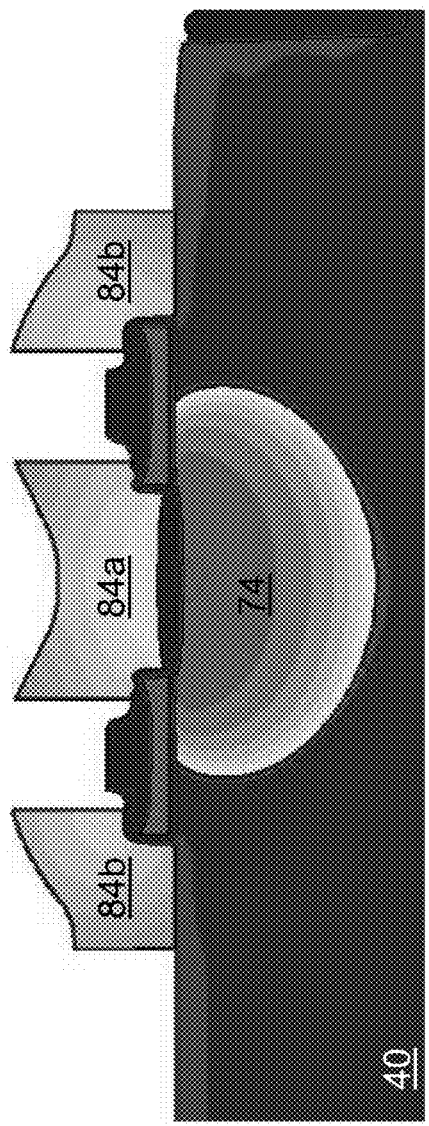
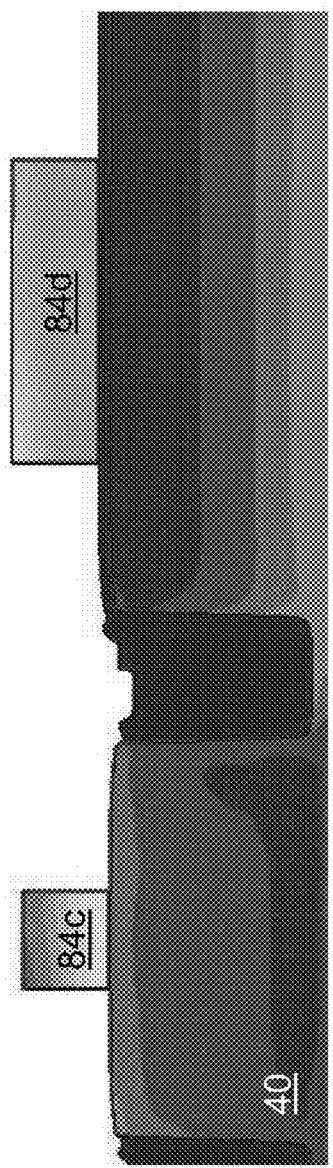

METHOD OF MANUFACTURING A SPLIT-GATE FLASH MEMORY CELL WITH ERASE GATE

This application claims the benefit of U.S. Provisional Application No. 62/567,840, filed Oct. 4, 2017, and which is incorporated herein by reference.

FIELD OF THE INVENTION

The present invention relates to non-volatile memory arrays.

BACKGROUND OF THE INVENTION

Split gate non-volatile memory cells, and arrays of such cells, are well known. For example, U.S. Pat. No. 5,029,130 ("the '130 patent") discloses an array of split gate non-volatile memory cells, and is incorporated herein by reference for all purposes. The memory cell is shown in FIG. 1. Each memory cell 10 includes source and drain regions 14/16 formed in a semiconductor substrate 12, with a channel region 18 there between. A floating gate 20 is formed over and insulated from (and controls the conductivity of) a first portion of the channel region 18, and over a portion of the drain region 16. A control gate 22 has a first portion 22a that is disposed over and insulated from (and controls the conductivity of) a second portion of the channel region 18, and a second portion 22b that extends up and over the floating gate 20. The floating gate 20 and control gate 22 are insulated from the substrate 12 by a gate oxide 26.

The memory cell is erased (where electrons are removed from the floating gate) by placing a high positive voltage on the control gate 22, which causes electrons on the floating gate 20 to tunnel through the intermediate insulation 24 from the floating gate 20 to the control gate 22 via Fowler-Nordheim tunneling.

The memory cell is programmed (where electrons are placed on the floating gate) by placing a positive voltage on the control gate 22, and a positive voltage on the drain 16. Electron current will flow from the source 14 towards the drain 16. The electrons will accelerate and become heated when they reach the gap between the control gate 22 and the floating gate 20. Some of the heated electrons will be injected through the gate oxide 26 onto the floating gate 20 due to the attractive electrostatic force from the floating gate 20.

The memory cell is read by placing positive read voltages on the drain 16 and control gate 22 (which turns on the channel region under the control gate). If the floating gate 20 is positively charged (i.e. erased of electrons and positively coupled to the drain 16), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state. Those skilled in the art understand that the source and drain can be interchangeable, where the floating gate can extend partially over the source instead of the drain, as shown in FIG. 2.

Split gate memory cells having more than two gates are also known. For example, U.S. Pat. No. 8,711,636 ("the '636 patent") discloses a memory cells with an additional coupling gate disposed over and insulated from the source region, for better capacitive coupling to the floating gate. See for example FIG. 3 showing coupling gate 24 disposed over source region 14.

A four gate memory disclosed in U.S. Pat. No. 6,747,310 ("the '310 patent"). For example, as shown in FIG. 4, the memory cells have source region 14, drain region 16, floating gate 20 over a first portion of channel region 18, a select gate 28 over a second portion of the channel region 18, a control gate 22 over the floating gate 20, and an erase gate 30 over the source region 14. Programming is shown by heated electrons from the channel region 18 injecting themselves onto the floating gate 20. Erasing is shown by electrons tunneling from the floating gate 20 to the erase gate 30.

The memory cells of FIGS. 1 and 2 have been successfully used as flash memory for several technology nodes. It is relatively easy to implement with a low cost process and good performance. One drawback is that the cell size is large and therefore can be competitive for advanced technology nodes. The memory cell of FIG. 4 has been successfully used as embedded flash for several advanced technology nodes. It has very good quality and a competitive cell size. However, the process cost is higher and more complicated than that of the cells in FIGS. 1 and 2. The memory cells of FIG. 3 are less complex than those of FIG. 4 because they have one less gate in each cell. But, conventional manufacturing techniques are still too complex and do not fully enable scaling down the memory cell size.

BRIEF SUMMARY OF THE INVENTION

The aforementioned problems and needs are addressed by a method of forming a memory device that includes:

providing a semiconductor substrate having a memory area, a first peripheral area and a second peripheral area;

forming a first insulation layer on a surface of the substrate in the memory, first peripheral and second peripheral areas;

forming a first polysilicon layer on the first insulation layer in the memory, first peripheral and second peripheral areas;

removing the first polysilicon layer from the first peripheral and second peripheral areas, and removing portions of the first polysilicon layer from the memory area, leaving a first polysilicon block of the first polysilicon layer in the memory area, wherein the first polysilicon block has first and second opposing ends;

removing portions of the first insulation layer that are not disposed under the first polysilicon block;

forming a source region in the substrate adjacent the first end of the first polysilicon block in the memory area;

forming a second insulation layer on the surface of the substrate in the second peripheral area;

forming a third insulation layer that wraps around an upper edge at the first end of the first polysilicon block;

forming a fourth insulation layer on the surface of the substrate over the source region in the memory area;

forming a fifth insulation layer on the surface of the substrate in the memory area adjacent the second end of the first polysilicon block, and on the surface of the substrate in the first peripheral area;

forming a second polysilicon layer on the second, third, fourth and fifth insulation layers in the memory, first peripheral and second peripheral areas;

removing portions of the second polysilicon layer, leaving a second polysilicon block of the second polysilicon layer on the fourth insulation layer and over the source region, a third polysilicon block of the second polysilicon layer on the fifth insulation layer in the memory area laterally adjacent to the second end of the first polysilicon block, a fourth polysilicon block of the second polysilicon layer on the fifth insulation layer in the first peripheral area, and a fifth polysilicon block of the second polysilicon layer on the second insulation layer in the second peripheral area;

forming a drain region in the substrate adjacent the third polysilicon block in the memory area;

forming a second source region in the substrate adjacent a first side of the fourth polysilicon block;

forming a second drain region in the substrate adjacent a second side of the fourth polysilicon block opposition of the first side of the fourth polysilicon block;

forming a third source region in the substrate adjacent a first side of the fifth polysilicon block;

forming a second drain region in the substrate adjacent a second side of the fifth polysilicon block opposition of the first side of the fifth polysilicon block.

Other objects and features of the present invention will become apparent by a review of the specification, claims and appended figures.

BRIEF DESCRIPTION OF THE DRAWINGS

FIGS. 5A-29A are cross sectional views of a memory area of the semiconductor substrate, illustrating the steps in forming pairs of memory cells.

FIGS. 5B-29B are cross sectional views of a low voltage logic circuit area and a high voltage logic circuit area of the semiconductor substrate, illustrating the steps in forming low and high voltage logic devices.

DETAILED DESCRIPTION OF THE INVENTION

Figure 1:
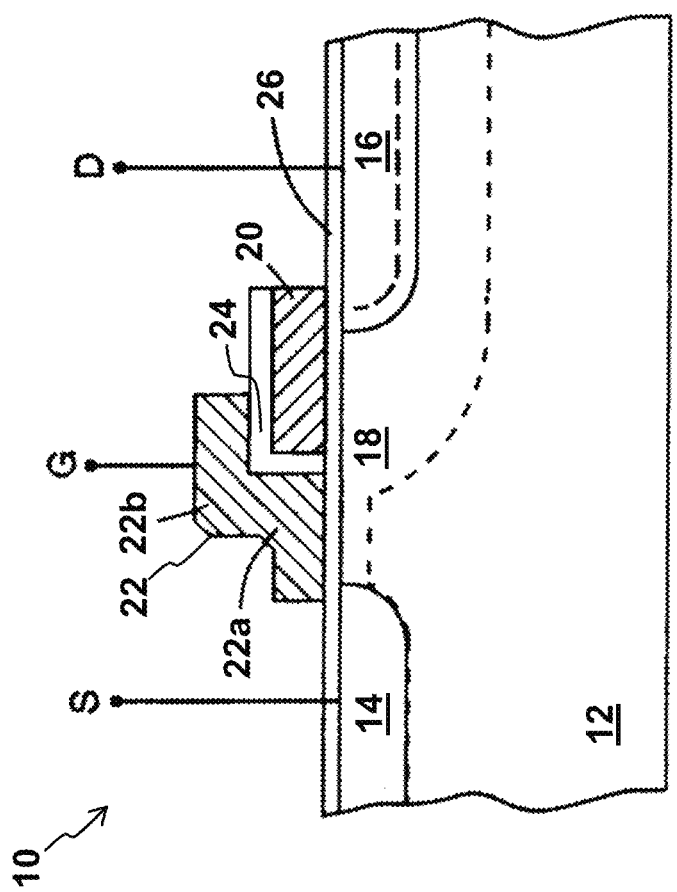
FIG. 1 is a cross sectional view of a conventional two-gate memory cell.
Figure 2:
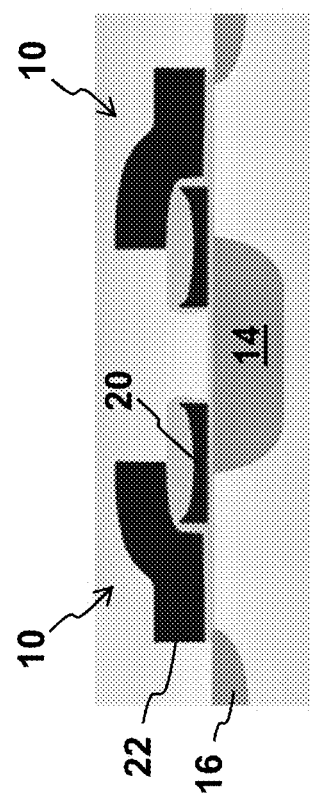
FIG. 2 is a cross sectional view of a conventional two-gate memory cell.
Figure 3:
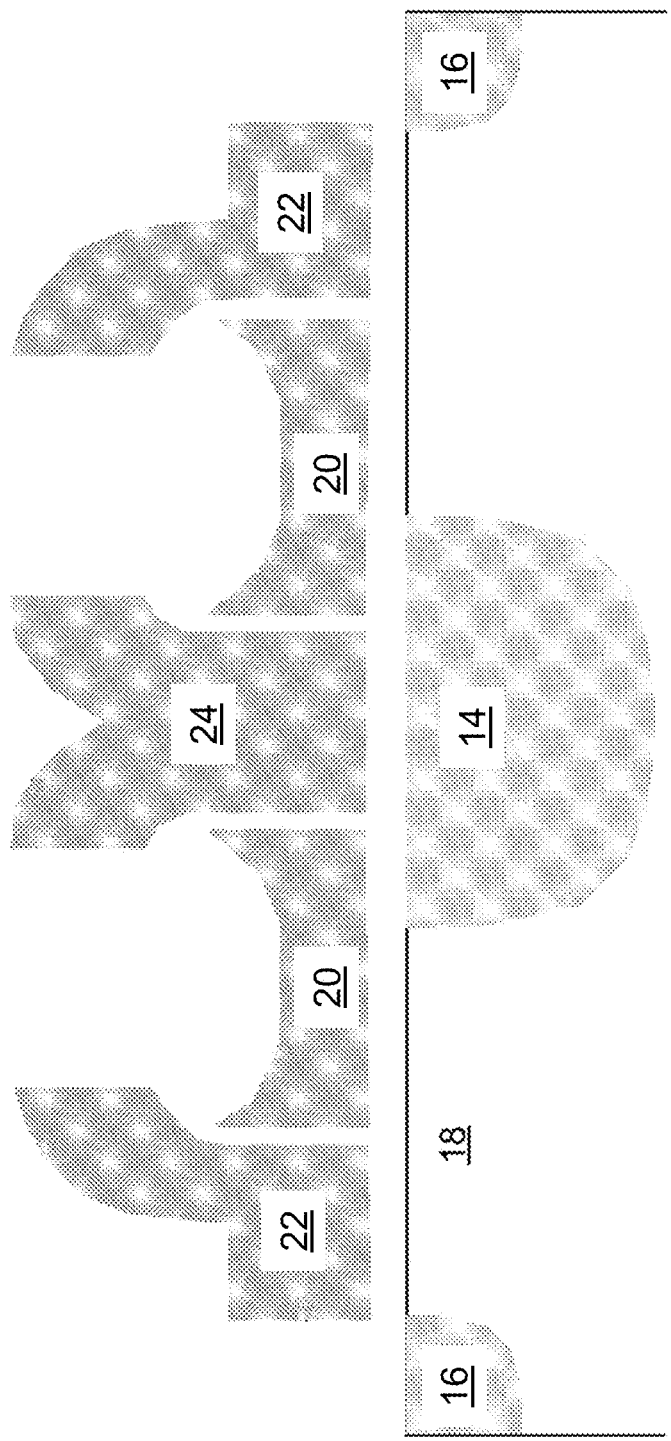
FIG. 3 is a cross sectional view of a conventional three-gate memory cell.
Figure 4:
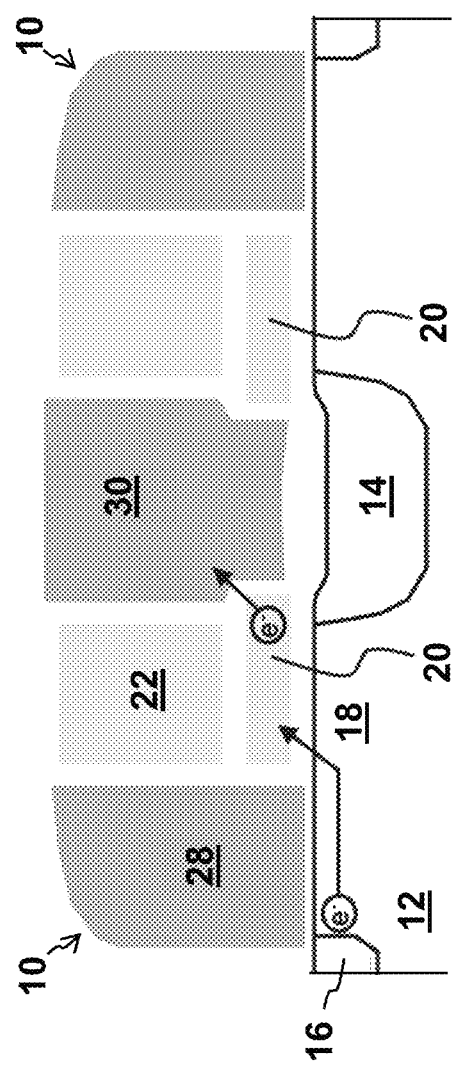
FIG. 4 is a cross sectional view of a conventional four-gate memory cell.
Figure 5A:
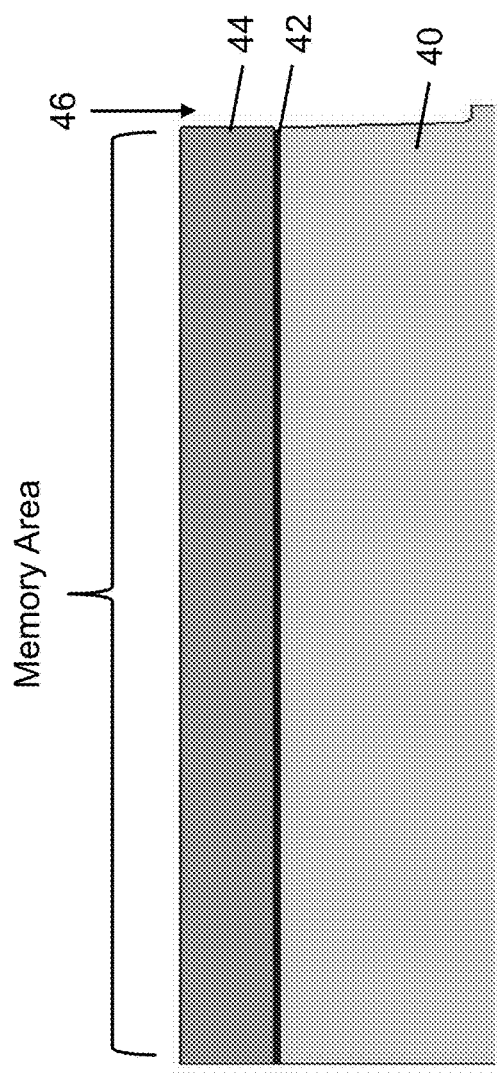
Figure 5B:
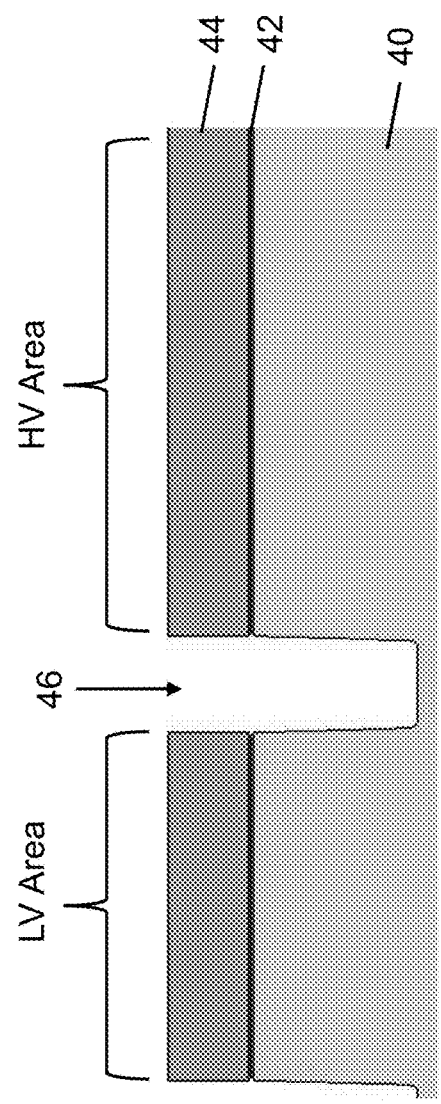
Figure 6A:
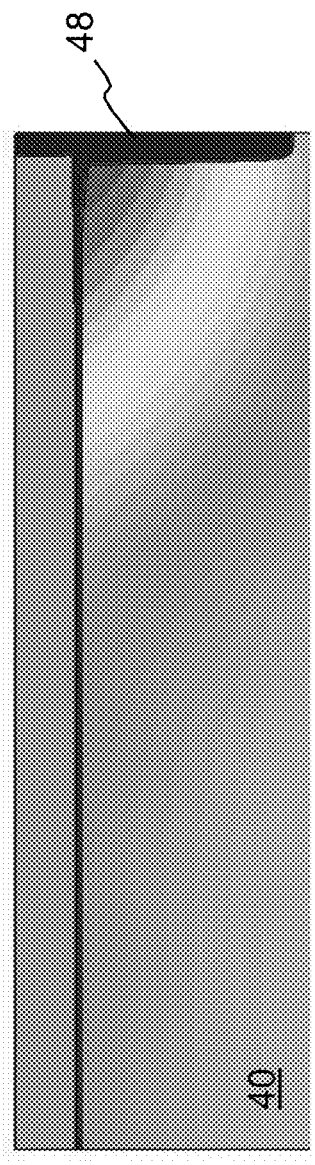
Figure 6B:
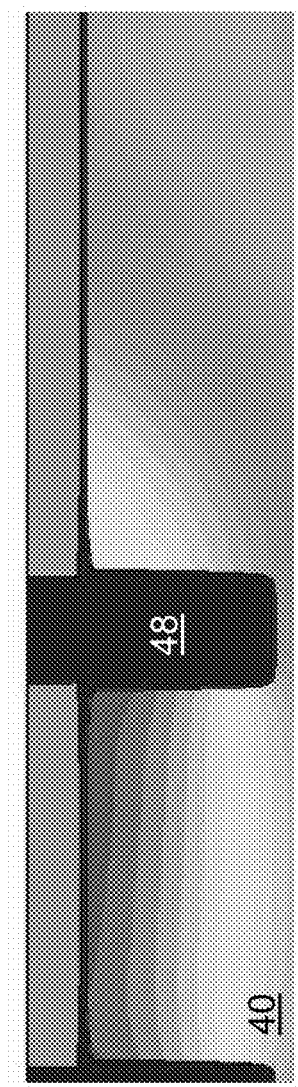
Figure 7A:
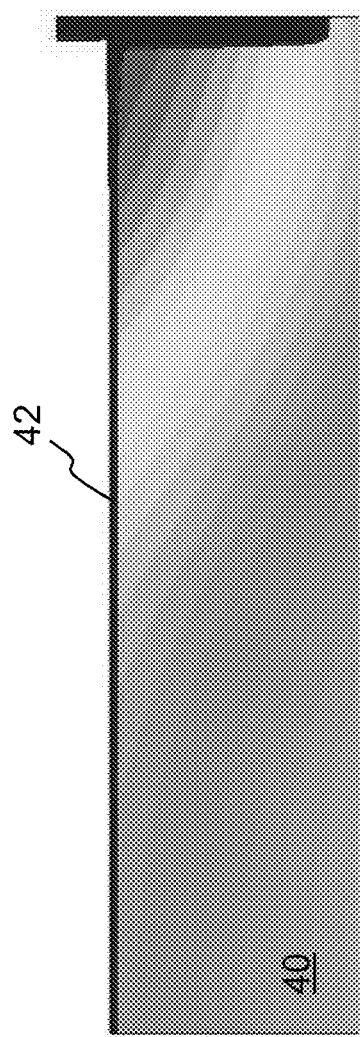
Figure 7B:
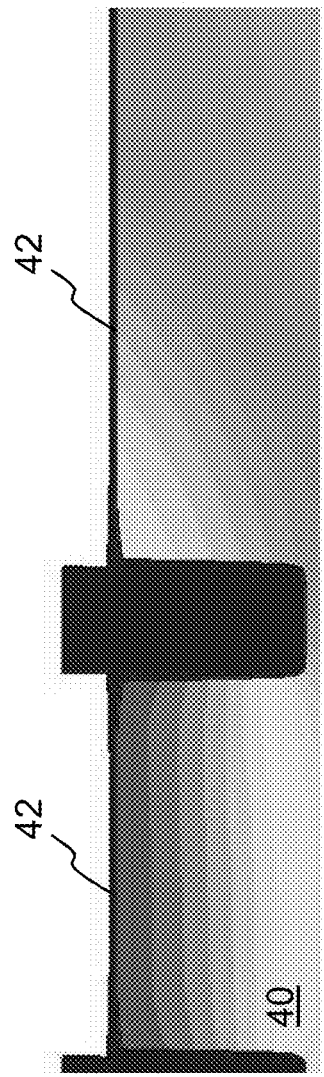
Figure 8A:
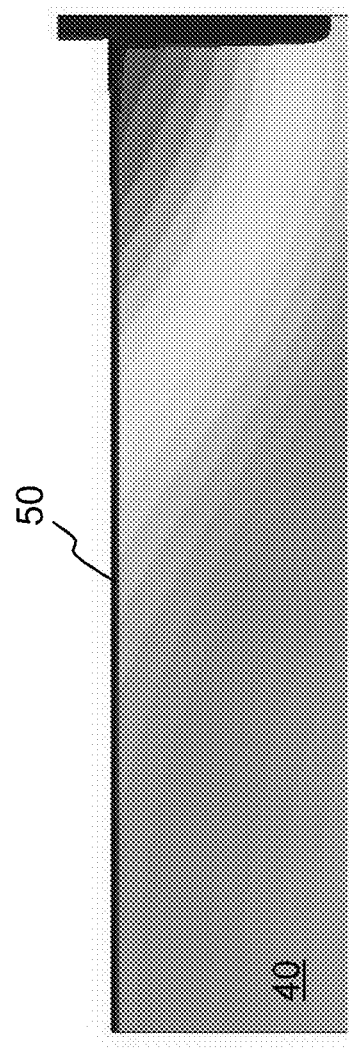
Figure 8B:
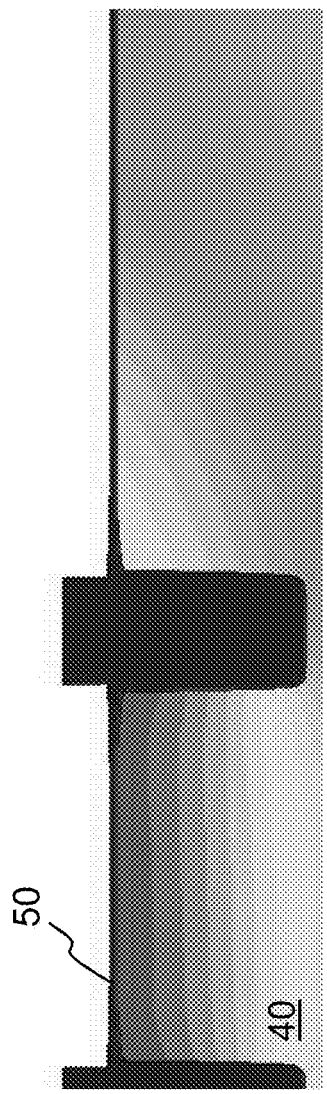
Figure 10A:
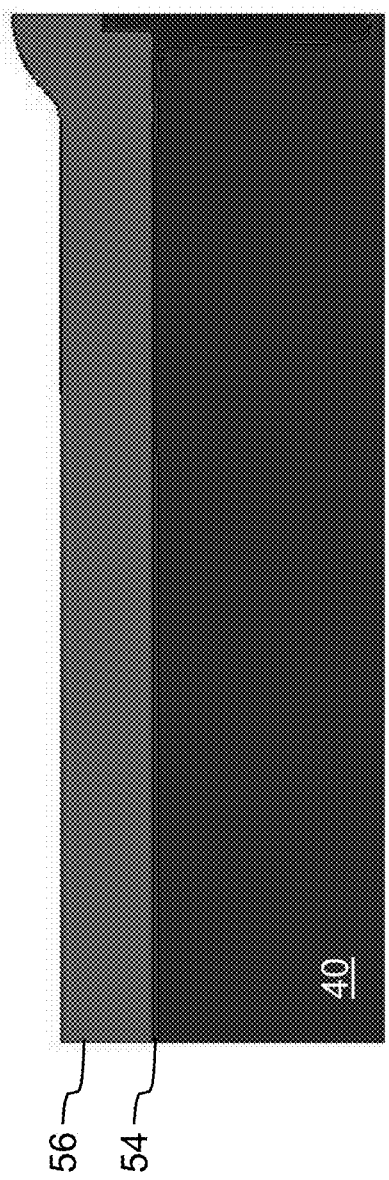
Figure 10B:
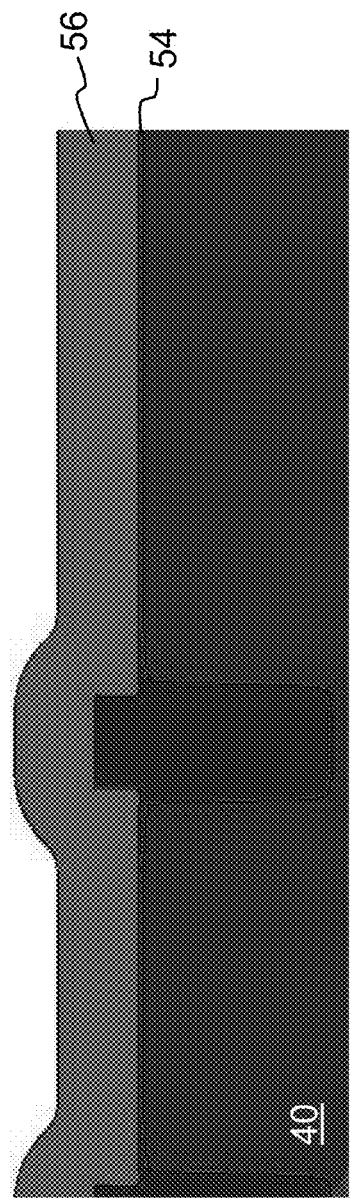
Figure 11A:
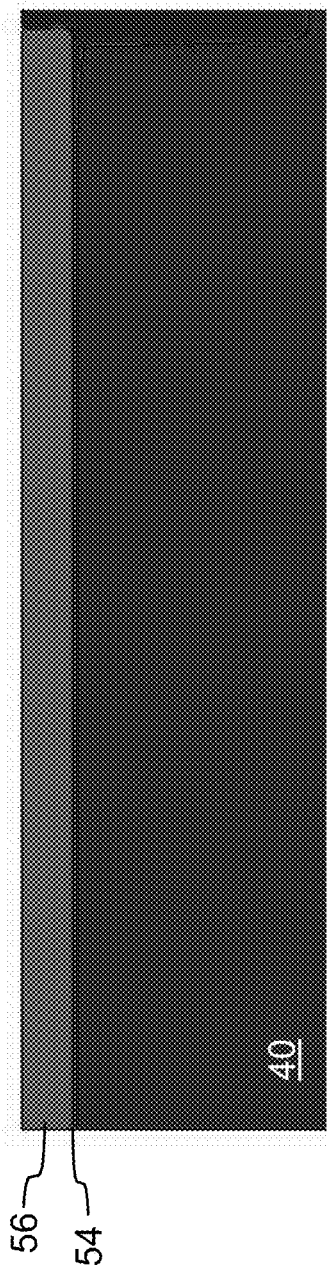
Figure 11B:
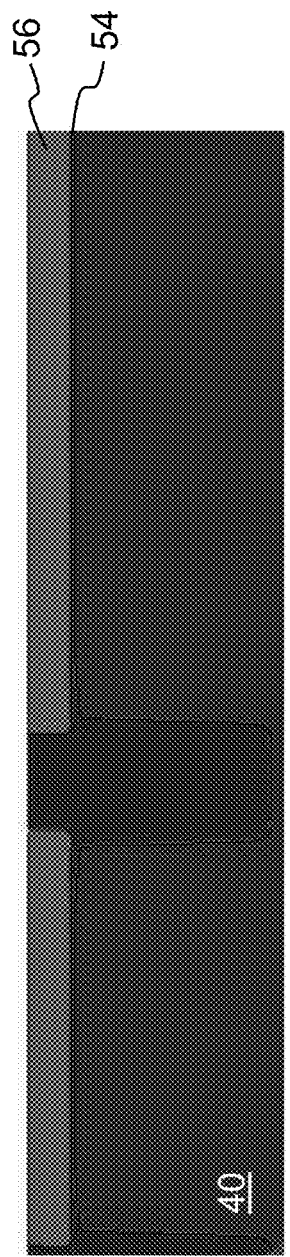
Figure 15A:
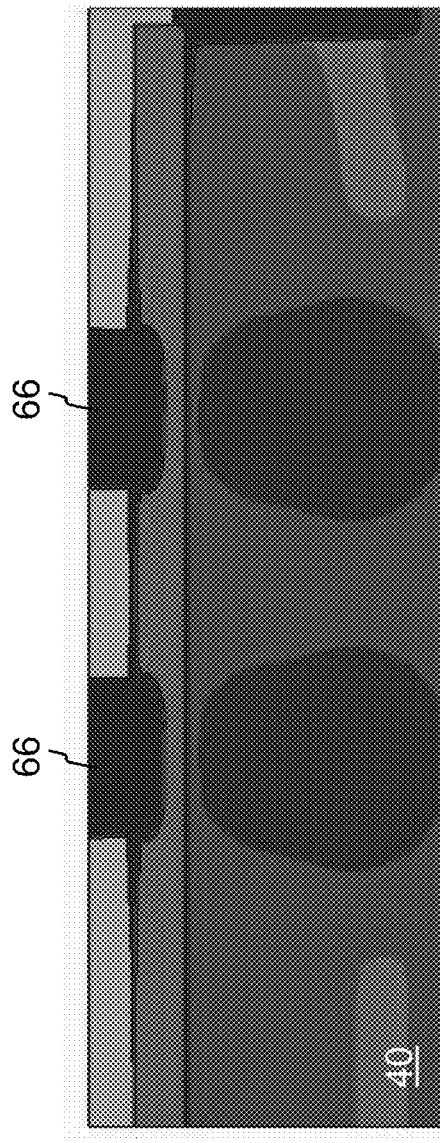
Figure 15B:
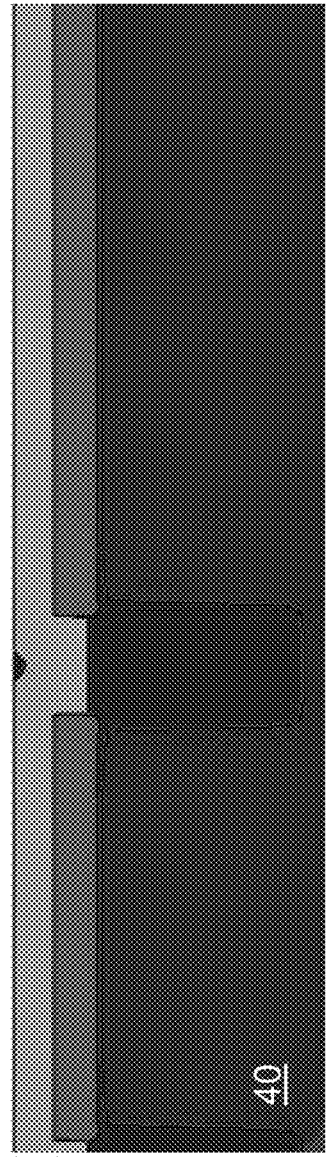
Figure 17A:
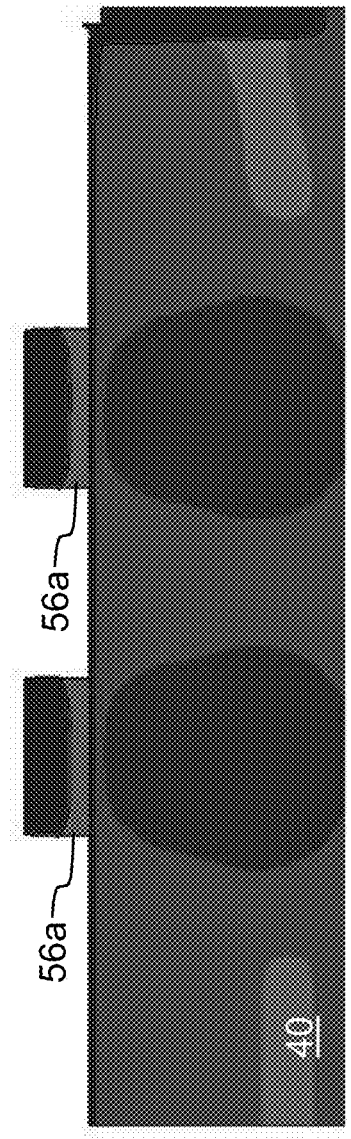
Figure 17B:
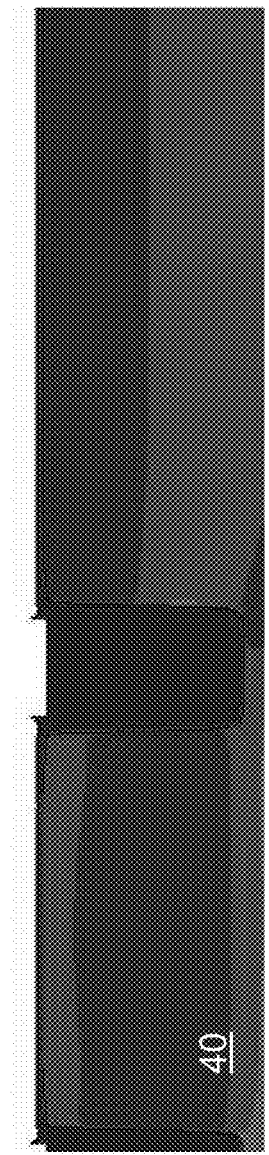
Figure 18A:
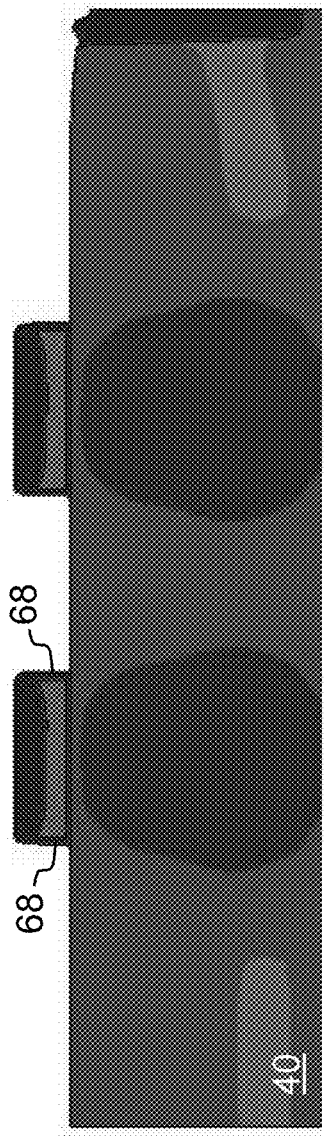
Figure 18B:
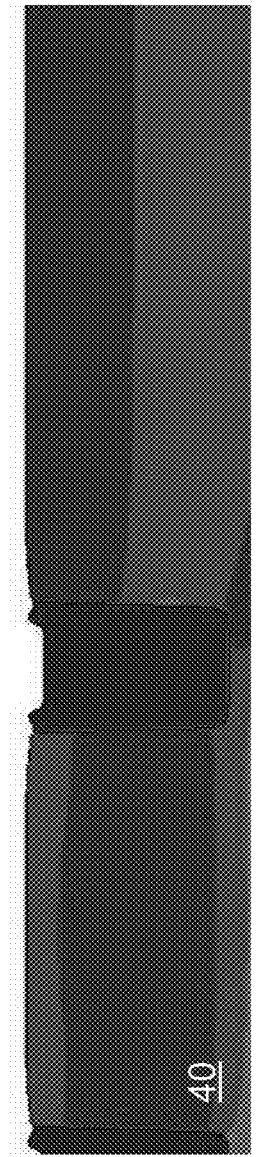
Figure 19A:
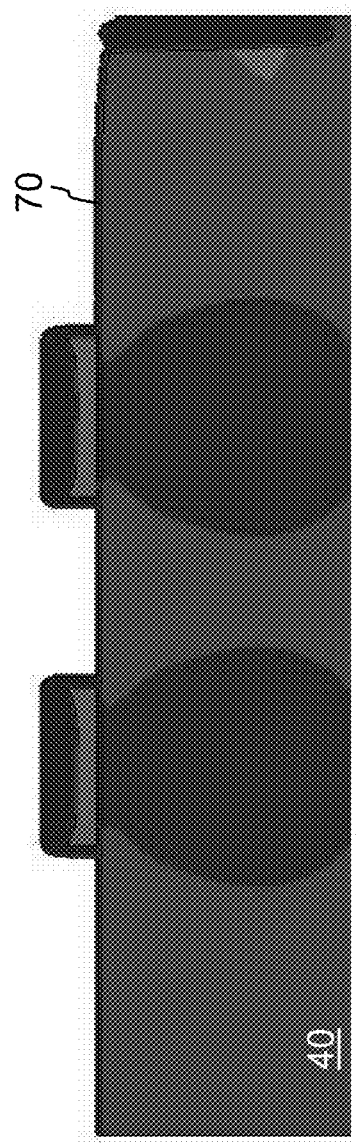
Figure 19B:
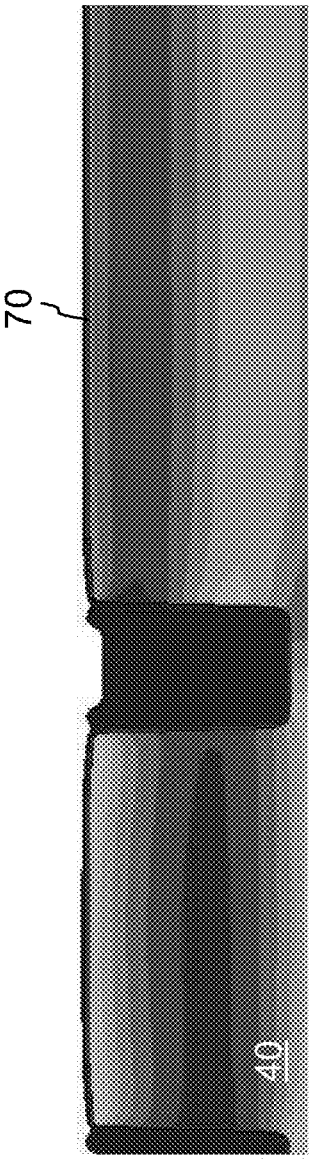
Figure 20A:
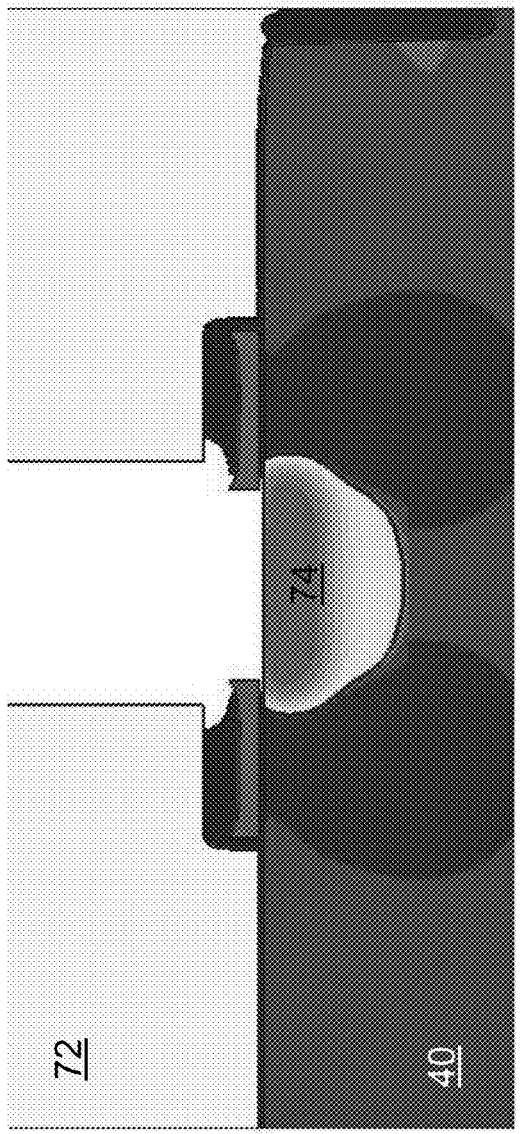
Figure 20B:
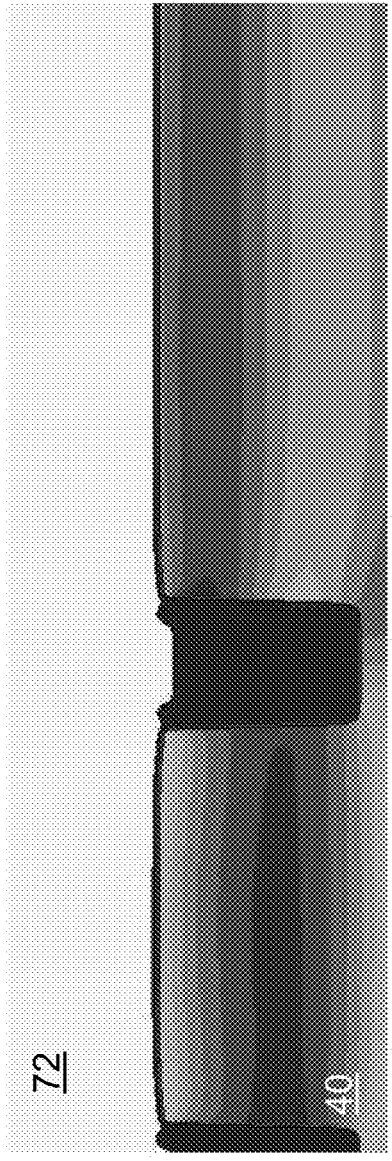
Figure 21A:
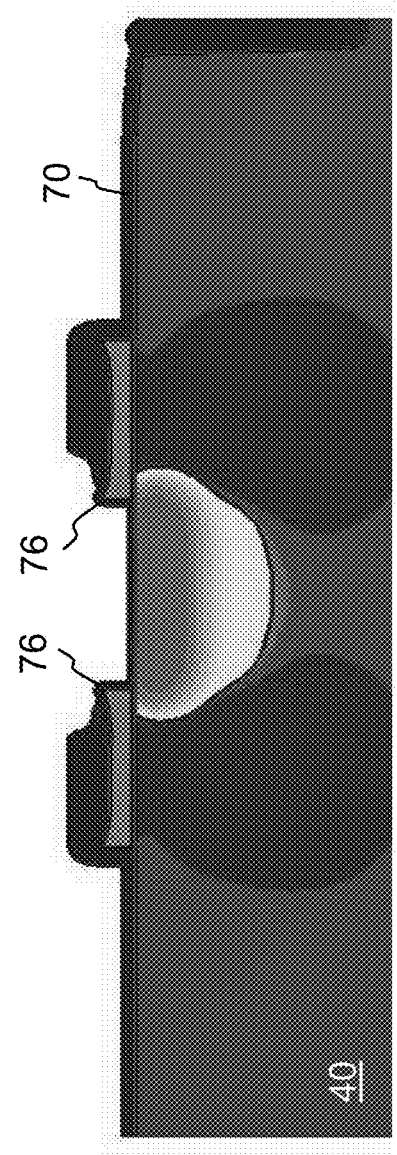
Figure 21B:
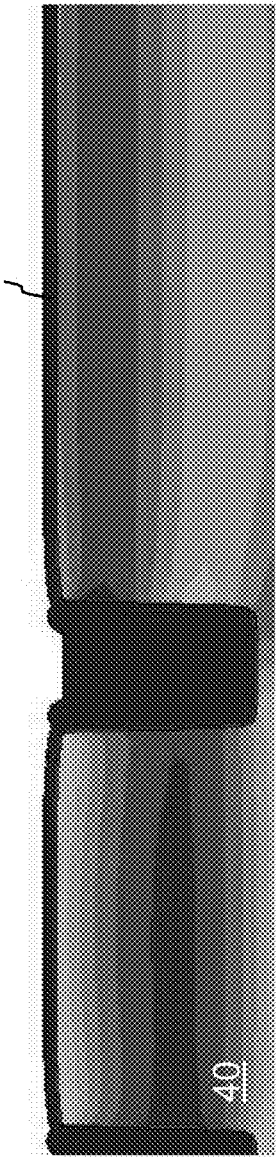
Figure 22A:
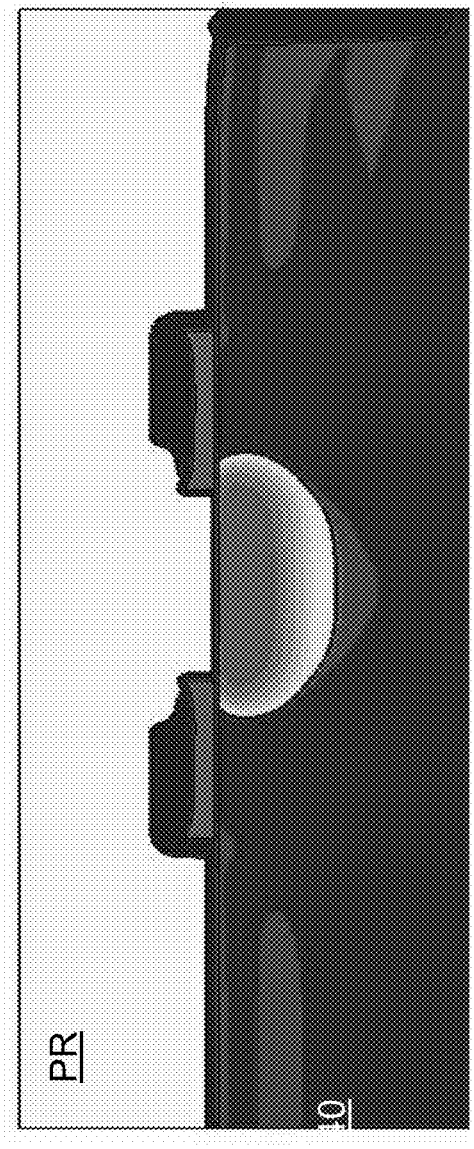
Figure 22B:
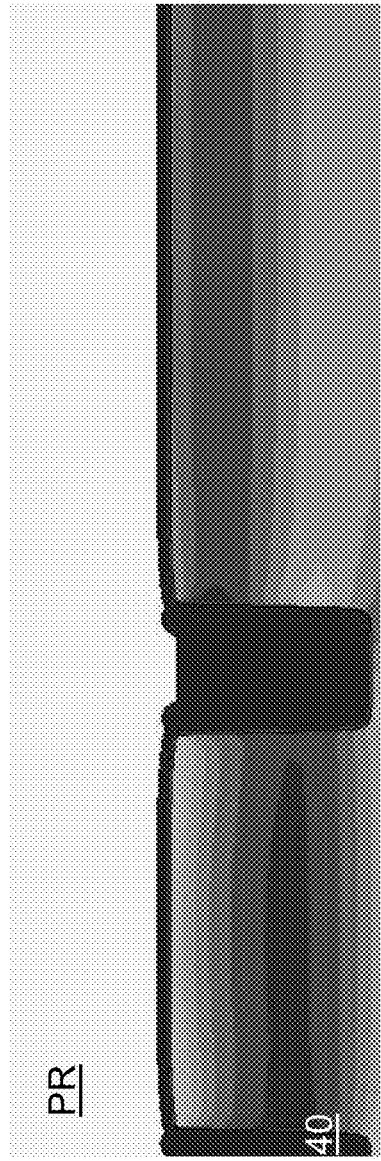
Figure 24A:
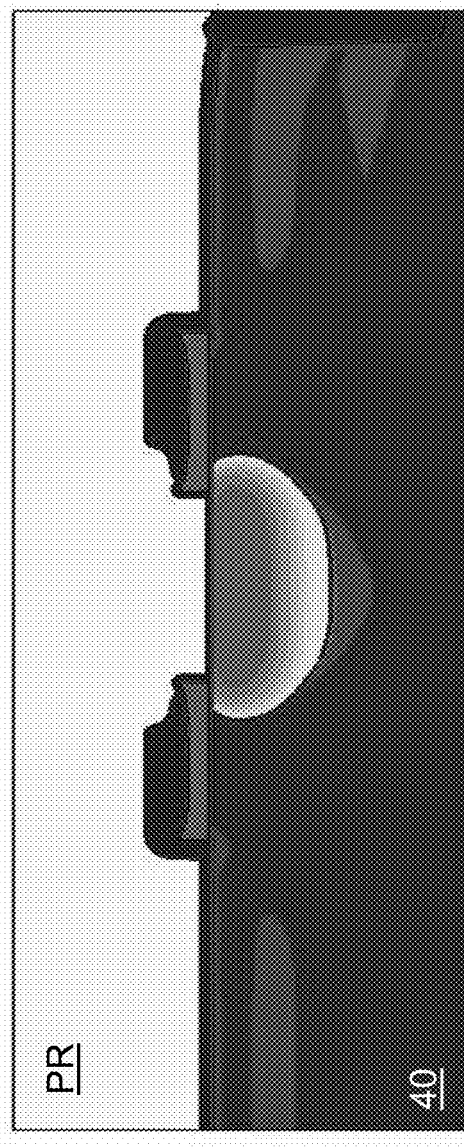
Figure 24B:
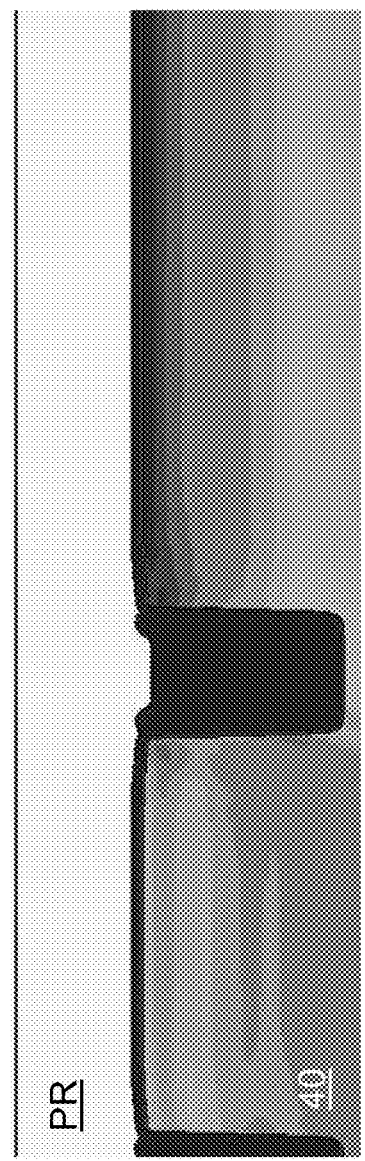
Figure 27A:
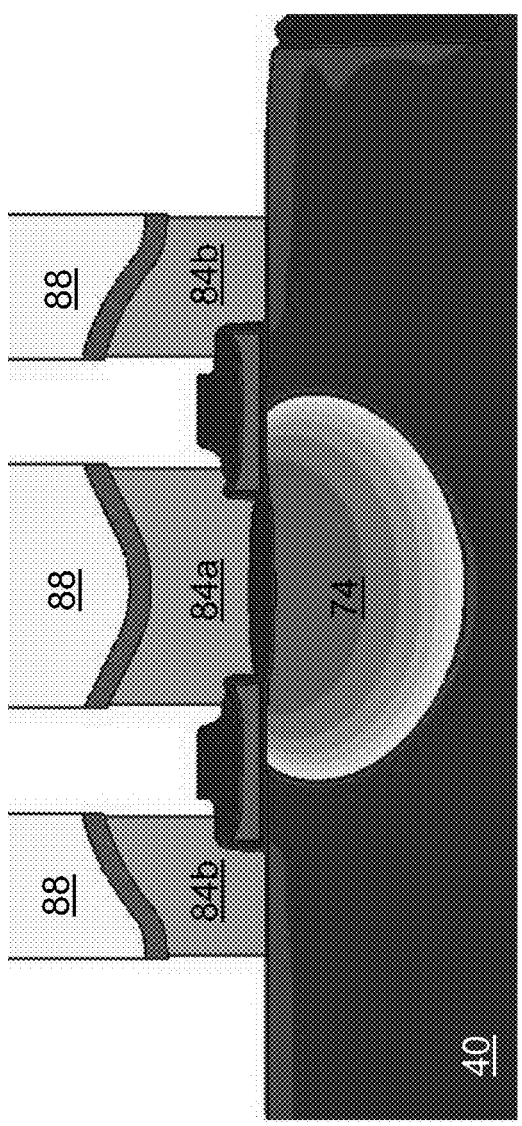
Figure 27B:
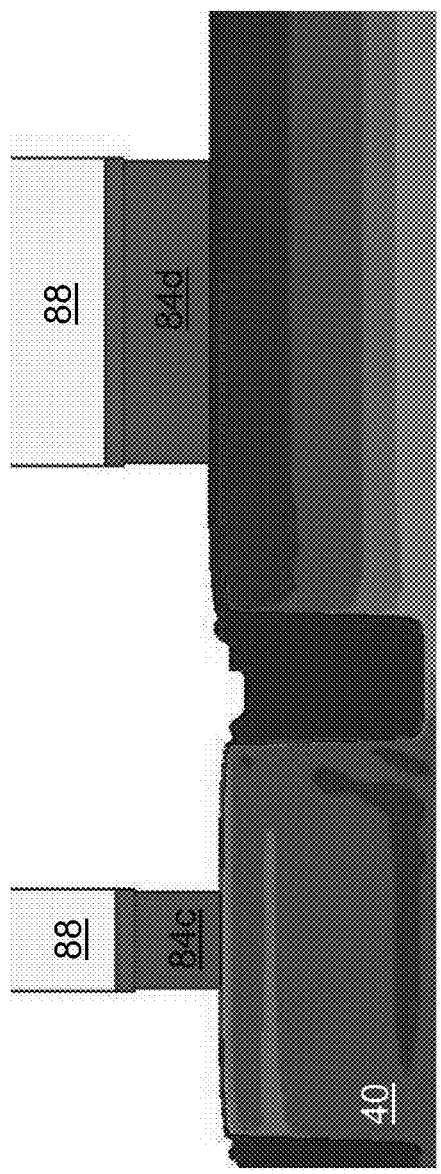

The present invention involves a new technique for making three gate memory cells on a substrate on which logic devices are also formed. FIGS. 5A-29A show the formation of the memory cells in the memory area of the substrate, and FIGS. 5B-29B show the formation of low (e.g., 1.2V) and high (HV) logic circuits in a peripheral region of the same substrate, namely a low voltage logic circuit (peripheral) area (LV area) and a high voltage logic circuit (peripheral) area (HV area). The process begins by forming a (pad) silicon dioxide (oxide) layer 42 on the semiconductor substrate 40, followed by a silicon nitride (nitride) layer 44 on the pad oxide layer 42, as shown in FIGS. 5A-5B. A masking step (i.e., photolithography photo resist deposition, exposure, selective photo resist removal) and etch are performed to form trenches 46 extending into the substrate. Trenches 46 separate the LV and HV areas, and separate columns of active regions in which the memory cells are formed in the memory area. The photo resist is then removed. See FIGS. 5A-5B.

The trenches 46 are filled with oxide 48 and the top surface is planarized by CMP even with the nitride layer 44 (i.e., STI insulation technique). See FIGS. 6A-6B. The nitride 44 is removed by a nitride etch, leaving the pad oxide 42 exposed. See FIGS. 7A-7B. The pad oxide 42 is removed by an oxide etch, and an optional sacrificial oxide layer 50 is formed on the substrate surface. An implant can also be performed at this time (e.g., ZMOS implant). See FIGS. 8A-8B. Multiple iterations of masking material formation and implant are performed for selectively implanting different materials into different regions of the substrate. See for example FIGS. 9A-9B, where photo resist 52 is formed in all three areas, removed from the memory and HV areas, whereby the implantation affects the memory and HV areas of the substrate but not the LV area. After photo resist removal, an oxide etch is used to remove the sacrificial oxide 50. An oxide layer 54 (referred to as the floating gate oxide because it will serve as the insulation between the floating gate and the substrate) is formed on the substrate 40, and a polysilicon layer 56 (referred to as the floating gate poly because portions thereof will serve as floating gates) is formed over the oxide layer 54. See FIGS. 10A-10B. The structure is planarized by a chemical mechanical polish (CMP). See FIGS. 11A-11B. The tops of the STI oxide 48 are recessed by an oxide etch so that their upper surface is recessed below the top surface of the poly layer 56. A nitride layer 58 is then formed on the structure. See FIGS. 12A-12B. A masking step (deposit photo resist 60, selectively expose and remove portions of the photo resist 60), followed by nitride etch, is used to form trenches 62 in the nitride layer 58 in the memory area (exposing the poly layer 56 underneath at the bottom of the trenches 62). See FIG. 13A. The nitride 58 in the peripheral LV and HV areas is maintained. See FIG. 13B. Appropriate implants can be performed at this time. An oxidation process is performed to oxidize the exposed portions of the poly layer 56 at the bottom of the trenches 62, creating oxidized regions 64 of the poly layer 56 so that each of those portions of the poly layer 56 have a curved/sloping upper surface. See FIG. 14A. The poly layer 56 in the peripheral regions is maintained. See FIG. 14B.

The trenches 62 are then filled with oxide 66 by oxide deposition and CMP. See FIGS. 15A-15B. The nitride layer 58 is removed by nitride etch, exposing poly layer 56. See FIGS. 16A-16B. A poly etch is used to remove all exposed portions of the poly layer 56 (leaving those portions in the memory area underneath the remaining oxide 66). Those remaining portions of the poly layer 56 have curved/sloped upper surfaces, and are blocks 56a of the poly layer 56 that will be the floating gates. Only one pair is shown in the figures, but multiple pairs will be formed. Poly layer 56 is completely removed from the logic areas. See FIGS. 17A-17B. Oxide spacers 68 are formed on the sides of the poly blocks 56a by oxide deposition (e.g., by high temperature oxide—HTO) and etch. The oxide etch removes any oxide remaining on the exposed substrate surface. See FIGS. 18A-18B. An oxide layer 70 (e.g. rapid thermal oxidation RTO and/or HTO) is formed on the substrate. See FIGS. 19A-19B. A masking step is performed to cover the structure with photo resist 72 except the space between pairs of the poly blocks 56a in the memory area. After an implant, an oxide etch is used to recess the oxide away from the side surfaces of the poly blocks 56a that face each other. An implant is also performed to form the source region 74 in the substrate between the pair of poly blocks 56a. See FIGS. 20A-20B. After photo resist removal, an oxide deposition (e.g., HTO) is used to form an oxide layer 76 around the exposed edges of the poly blocks 56a in the memory area. This oxide layer will be the erase tunneling oxide, and can be advantageously thin because it is formed directly on the exposed sides/corner of the recently etched poly blocks 56a.

Oxide 70 is thickened elsewhere. See FIGS. 21A-21B. A series of mask and implant steps are used to selectively cover the structure with photo resist PR and implant different areas of the substrate. See FIGS. 22A-22B (logic well implant), 23A-23B (logic well implant) and 24A-24B (LVOX Dip).

Figure 29A:
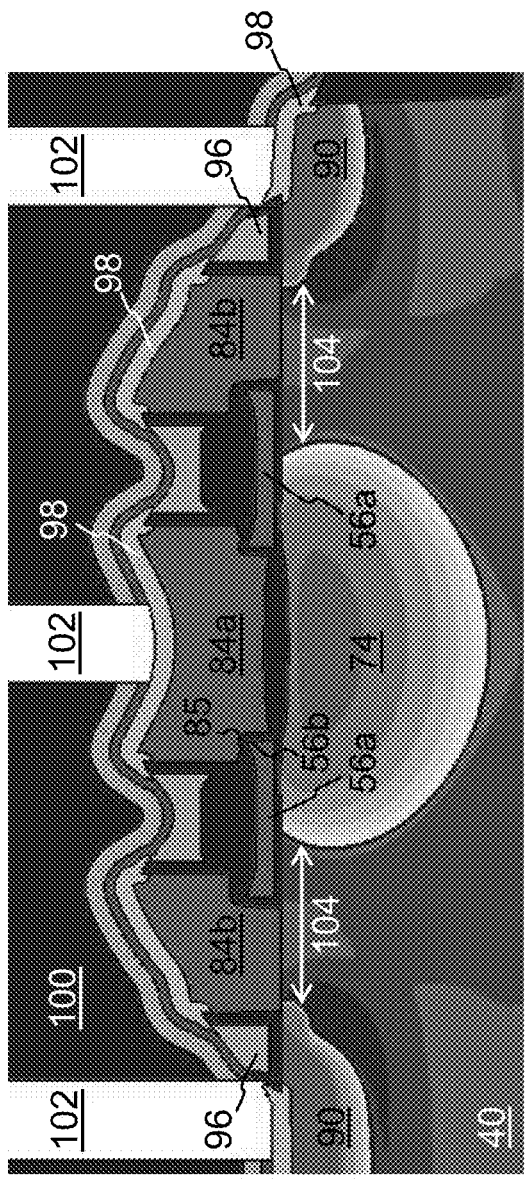
Figure 29B:
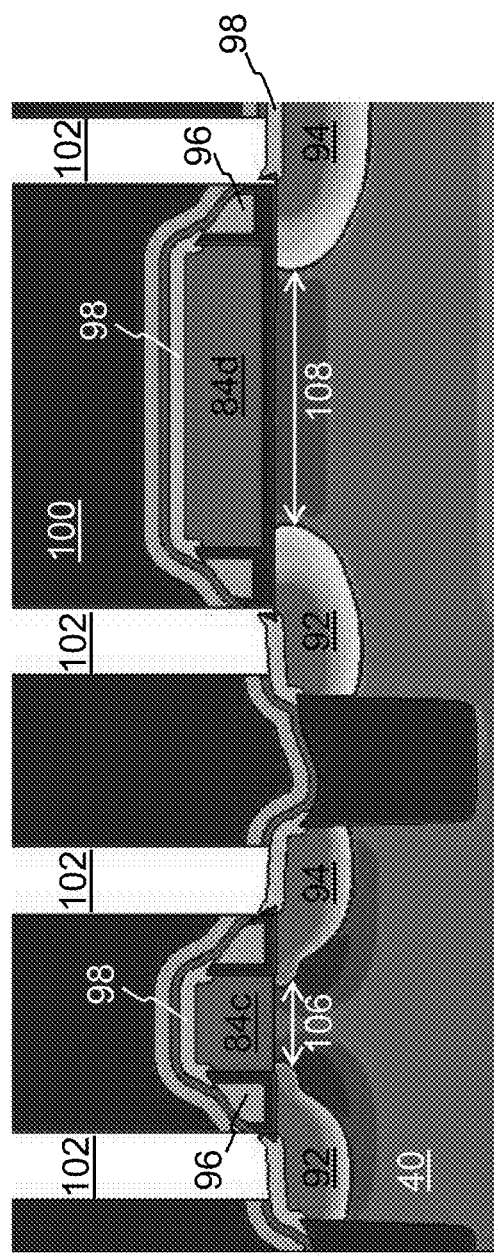

A masking step is performed to cover the HV area, and portions of the memory area between the pairs of poly blocks 56a, with photo resist 80. An oxide etch is then used to remove exposed portions of oxide 70 (i.e. in the areas outside of the pairs of poly blocks 56a in the memory area and in the LV area). See FIGS. 25A-25B. Exposed portions of the substrate 40 are oxidized to form a thin layer of oxide 82 in the memory and LV areas, and to thicken the oxide on the source region 74. A layer of polysilicon 84 is then deposited on the structure, followed by the deposition of a SION layer 86 on the poly layer 84. See FIGS. 26A-26B. A masking step is then performed to cover portions of the structure with photo resist 88, and selectively remove exposed portions of the SION layer 86 and poly layer 84 from the memory and periphery areas. This step leaves behind poly block 84a over source region (that will be the erase gate) and poly blocks 84b over the outer portions of the substrate (that will be the word line gates) for each pair of floating gate poly blocks 56a in the memory area, poly blocks 84c in the LV area (that will be the logic gates for the LV peripheral circuitry) and poly blocks 84d in the HV area (that will be the logic gates for the HV peripheral circuitry). See FIGS. 27A-27B. The photo resist 88 and SION layer 86 are removed, and the structures are annealed. See FIGS. 28A-28B. Masking and implants are performed to form drain regions 90 in the substrate adjacent the poly blocks 84b in the memory area, and source/drain regions 92/94 in the substrate adjacent the gates 84c/84d in the LV and HV areas. Insulation spacers 96 are formed in all areas by oxide deposition and etch. Silicide 98 is formed on the exposed poly layers/blocks and substrate surfaces. The structures are covered with ILD insulation 100, through which contact holes 102 are formed. The final structures are shown in FIGS. 29A-29B.

In the memory area, pairs of memory cells are formed, with each memory cell including a source region 74 and a drain region 90, with a channel region 104 of the substrate extending there between, a floating gate 56a disposed over and controlling the conductivity of a first portion of the channel region 104 (and disposed over a portion of the source region 74), a word line gate 84b disposed over and controlling the conductivity of a second portion of the channel region 104, and an erase gate 84a disposed over the source region 74 (and shared among the pair of memory cells). The erase gate 84a has an upper portion that extends up and over a portion of the floating gate 56a, with a notch 85 that wraps around the sharp tip 56b formed at the edge of the floating gate 56a (for enhanced tunneling during erase).

In the LV area, low voltage logic devices are formed, each having a source region 92 and a drain region 94, with a channel region 106 of the substrate extending there between, and a logic gate 84c disposed over and controlling the conductivity of the channel region 106. In the HV area, high voltage logic devices are formed, each having a source region 92 and a drain region 94, with a channel region 108 of the substrate extending there between, and a logic gate 84d disposed over and controlling the conductivity of the channel region 108. The insulation layer under logic gate 84d in the HV area is thicker than that under logic gate 84c in the LV area, for using a higher operational voltage for the logic device in the HV area. The logic gate 84d in the HV area is preferably larger in terms of lateral dimensions that logic gate 84c in the LV area.

The above identified memory device formation process has many advantages. First, the same poly layer for forming the word line gates 84b is used to form the erase gates 84a and the logic gates 84c/84d. A single masking step and etch can be used to define the side edges of gates 84a, 84b, 84c and 84d. The tunnel oxide 76 between floating gate 56a and the erase gate 84a is separate (i.e. separately formed) from the oxide 82 between the word line gate 84b and the substrate 40, so that the oxide 82 can be independently scaled down in relative thickness for better performance. The floating gate 56a in the width direction (between the source and drain) is formed by a self-aligned technique, so that cell width can be reliably scaled. With the erase gate 84a coupling to the floating gate 56a during program, the voltage on the source region 74 can be scaled down and therefore the floating gate portion of the channel region 104 (i.e., portion of substrate under the floating gate 56a) can be scaled down. The word line threshold voltage can be adjusted by using one or more well implants. By having a separate erase gate 84a, the oxide between the erase gate 84a and the source region 74 can be thicker than the tunnel oxide 76, which is thicker than the oxide 82 under the word line gate 84b, and provides better endurance. The word line gate oxide 82 can be combined with low voltage oxide under gate 84c, so the length of the channel region 104 under the word line gate 84b can be shorter. The sharp tip/edge 56b of the floating gate 56a facing the erase gate 84a enhances erase tunneling performance. All of these advantages together make it much easier to scale down the size of the memory device.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory device of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a memory device, comprising:
providing a semiconductor substrate having a memory area, a first peripheral area and a second peripheral area;
forming a first insulation layer on a surface of the substrate in the memory, first peripheral and second peripheral areas;
forming a first polysilicon layer on the first insulation layer in the memory, first peripheral and second peripheral areas;
removing the first polysilicon layer from the first peripheral and second peripheral areas, and removing portions of the first polysilicon layer from the memory area, leaving a first polysilicon block of the first polysilicon layer in the memory area, wherein the first polysilicon block has first and second opposing ends;
removing portions of the first insulation layer that are not disposed under the first polysilicon block;
forming a source region in the substrate adjacent the first end of the first polysilicon block in the memory area;
forming a second insulation layer on the surface of the substrate in the second peripheral area;
forming a third insulation layer that wraps around an upper edge at the first end of the first polysilicon block;
forming a fourth insulation layer on the surface of the substrate over the source region in the memory area;
forming a fifth insulation layer on the surface of the substrate in the memory area adjacent the second end of the first polysilicon block, and on the surface of the substrate in the first peripheral area;
forming a second polysilicon layer on the second, third, fourth and fifth insulation layers in the memory, first peripheral and second peripheral areas;
removing portions of the second polysilicon layer, leaving a second polysilicon block of the second polysilicon layer on the fourth insulation layer and over the source region, a third polysilicon block of the second polysilicon layer on the fifth insulation layer in the memory area laterally adjacent to the second end of the first polysilicon block, a fourth polysilicon block of the second polysilicon layer on the fifth insulation layer in the first peripheral area, and a fifth polysilicon block of the second polysilicon layer on the second insulation layer in the second peripheral area;
forming a drain region in the substrate adjacent the third polysilicon block in the memory area;
forming a second source region in the substrate adjacent a first side of the fourth polysilicon block;
forming a second drain region in the substrate adjacent a second side of the fourth polysilicon block opposition of the first side of the fourth polysilicon block;
forming a third source region in the substrate adjacent a first side of the fifth polysilicon block;
forming a second drain region in the substrate adjacent a second side of the fifth polysilicon block opposition of the first side of the fifth polysilicon block.

2. The method of claim 1, further comprising:
removing a portion of an upper surface of the first polysilicon block so that the upper surface is sloped and terminates in a sharp edge at the first end of the first polysilicon block.

3. The method of claim 2, wherein the second polysilicon block includes a notch that wraps around the sharp edge.

4. The method of claim 1, wherein the removing of the portions of the second polysilicon layer that leaves the second, third, fourth and fifth polysilicon blocks is performed using a single polysilicon etch.

5. The method of claim 1, wherein the removing of the first polysilicon layer from the first peripheral and second peripheral areas, and the removing of the portions of the first polysilicon layer from the memory area leaving the first polysilicon block of the first polysilicon layer in the memory area, are performed using a single polysilicon etch.

6. The method of claim 1, further comprising:
forming spacers of insulation material on the first and second ends of the first polysilicon block; and
removing the spacer of insulation material on the first end of the first polysilicon block before the forming of the third insulation layer.

7. The method of claim 1, wherein a thickness of the fifth insulation layer is less than a thickness of the third insulation layer.

8. The method of claim 1, wherein a thickness of the fifth insulation layer is less than a thickness of the second insulation layer.

9. The method of claim 1, further comprising:
forming silicide on upper surfaces of the second, third, fourth and fifth polysilicon blocks.

10. The method of claim 1, further comprising:
forming silicide on portions of the surface of the substrate that are over the drain region, the first and second source regions and the first and second drain regions.

* * * * *